United States Patent [19]

Flükiger

[11] Patent Number: 4,746,581
[45] Date of Patent: May 24, 1988

[54] MULTIFILAMENTARY SUPERCONDUCTIVE WIRES COMPOSED OF FILAMENTS $Nb_3Sn$ OR $V_3Ga$ CLAD IN COPPER OR COPPER ALLOYS AND PROCESS FOR MANUFACTURING SUCH WIRES

[75] Inventor: Rene Flükiger, Karlsruhe, Fed. Rep. of Germany

[73] Assignee: Kernforschungszentrum Karlsruhe GmbH, Karlsruhe, Fed. Rep. of Germany

[21] Appl. No.: 903,988

[22] Filed: Sep. 5, 1986

[30] Foreign Application Priority Data

Sep. 6, 1985 [DE] Fed. Rep. of Germany ....... 3531770

[51] Int. Cl.[4] .......................................... H01B 12/00
[52] U.S. Cl. .................... 428/614; 428/662; 428/930; 148/11.5 Q; 148/11.5 P; 148/11.5 F; 419/29; 29/599
[58] Field of Search .............. 428/930, 614, 642, 662; 29/599; 419/29; 148/11.5 F, 11.5 P, 11.5 Q, 127

[56] References Cited

U.S. PATENT DOCUMENTS

| | | | |
|---|---|---|---|
| 3,525,150 | 8/1970 | Deiness | 428/930 |
| 3,778,260 | 12/1973 | Kawabe et al. | 29/599 |
| 4,336,065 | 6/1982 | Bergmann et al. | 75/200 |
| 4,402,768 | 9/1983 | Flukiger | 148/11.5 P |
| 4,409,297 | 10/1983 | Howe | 428/930 |
| 4,411,959 | 10/1983 | Braginski et al. | 428/930 |

FOREIGN PATENT DOCUMENTS

| | | | |
|---|---|---|---|
| 48313 | 3/1982 | European Pat. Off. | |
| 54421 | 6/1982 | European Pat. Off. | 29/599 |
| 2909290 | 9/1980 | Fed. Rep. of Germany | |
| 32478 | 9/1976 | Japan | 428/930 |
| 56894 | 5/1977 | Japan | 29/599 |
| 1499507 | 2/1978 | United Kingdom | 428/930 |

OTHER PUBLICATIONS

Flükiger et al., "Fabrication . . . of Cu-Nb-Sn Multifilamentary Superconducting Composite Wires . . . ", Appl. Phys. Lett. 35(10), Nov. 1979, pp. 810–812.
Kaufmann et al, "Multifilament $Nb_2Sn$ Superconducting Wire", J. Appl. Phys. Jan. 1971, vol. 42, No. 1, p. 58.
Suenaga et al, "Superconducting Properties of Multifilamentary $Nb_3Sn$ Made by a New Process", Appl. Phys. Lett., vol. 20, No. 11, 6/1/72, pp. 443–445.
Bormann et al "$V_3Ga$ Micro-Composite Conductors: Preparation and Superconducting Properties", IEEE Trans. on Magnetics., vol. MAG-17, No. Jan. 1981, pp. 270–273.
Hashimoto et al, "M4 Processing and Properties of Superconducting $Nb_3Sn$ Filamentary Wires", 5th Int. Cryogenic Eng. Conf., IPC Sc. & Tech. Press, 1974, pp. 332–335.
Flükiger, "A15 Superconducting Wires Produced by Discontinuous Fibre Methods", IEEE Trans. on Magnetics, vol. MAG-16, No. 5, Sep. 1980, pp. 1236–1241.
McDonald et al, "Manufacture and Evaluation of $Nb_3Sn$ Conductors Fabricated by the MJR Method", IEEE Trans. on Mags. vol. MAG-19, No. 3, May 1983, pp. 1124–1127.
Hemachalam et al, "Studies on Filamentary $Nb_3Sn$ Wires Fabricated by the Infiltration Method", IEEE Trans. on Mags. vol. MAG-13, No. 1, Jan. 1977, pp. 466–469.

(List continued on next page.)

Primary Examiner—John J. Zimmerman
Attorney, Agent, or Firm—Spencer & Frank

[57] ABSTRACT

A multifilamentary, copper or copper alloy clad superconductive wire, comprising a superconductive, intermetallic compound $Nb_3Sn$ or $V_3Ga$, having an A-15 crystal structure, and at least one additive metal from the group consisting of rare earth elements of atomic number 57 to 71, Th, U, Ti, Zr, Hf, V, Nb, Ta, Mo, Fe, Co, Ni, Pd, Cu, Ag, Al, and Pt. The additive is present in the wire within the A-15 phase in the form of uniformly and finely distributed, at least partially undissolved axially parallel inclusions at grain boundaries of the crystals and/or at an interface between the A-15 phase and the copper or copper alloy, or at an interface between the A-15 phase and a separate phase.

19 Claims, 1 Drawing Sheet

OTHER PUBLICATIONS

Veringa et al, "Growth Kinetics & Characterization of Superconducting Properties of Multifilament Materials Made by the ECN Powder Method", IEEE Trans. vol. MAG19 No. 1, 5/83, pp. 773–776.

Tsuei, "Ductile Superconducting Copper–Base Alloys", Science, vol. 180, Apr. 6, 1973, pp. 57,58.

Schauer et al, "Improvement of $Nb_3Sn$ High Field Critical Current by a Two-Stage Reaction", IEEE Trans. Magn. MAG-17, 1981, pp. 374–377.

G. Gauss, Primary Report of the Karlsruhe Nuclear Research Center, pp. 1–7 (Aug. 1987).

S. Gauss and R. Flükiger, "Powder Metallurgical Alternative for the Processing, of $(Nb-Ta)_3Sn$ Multifilamentary Wires, Starting from Elementary Nb and Ta Powder", (Sep. 30, 1986).

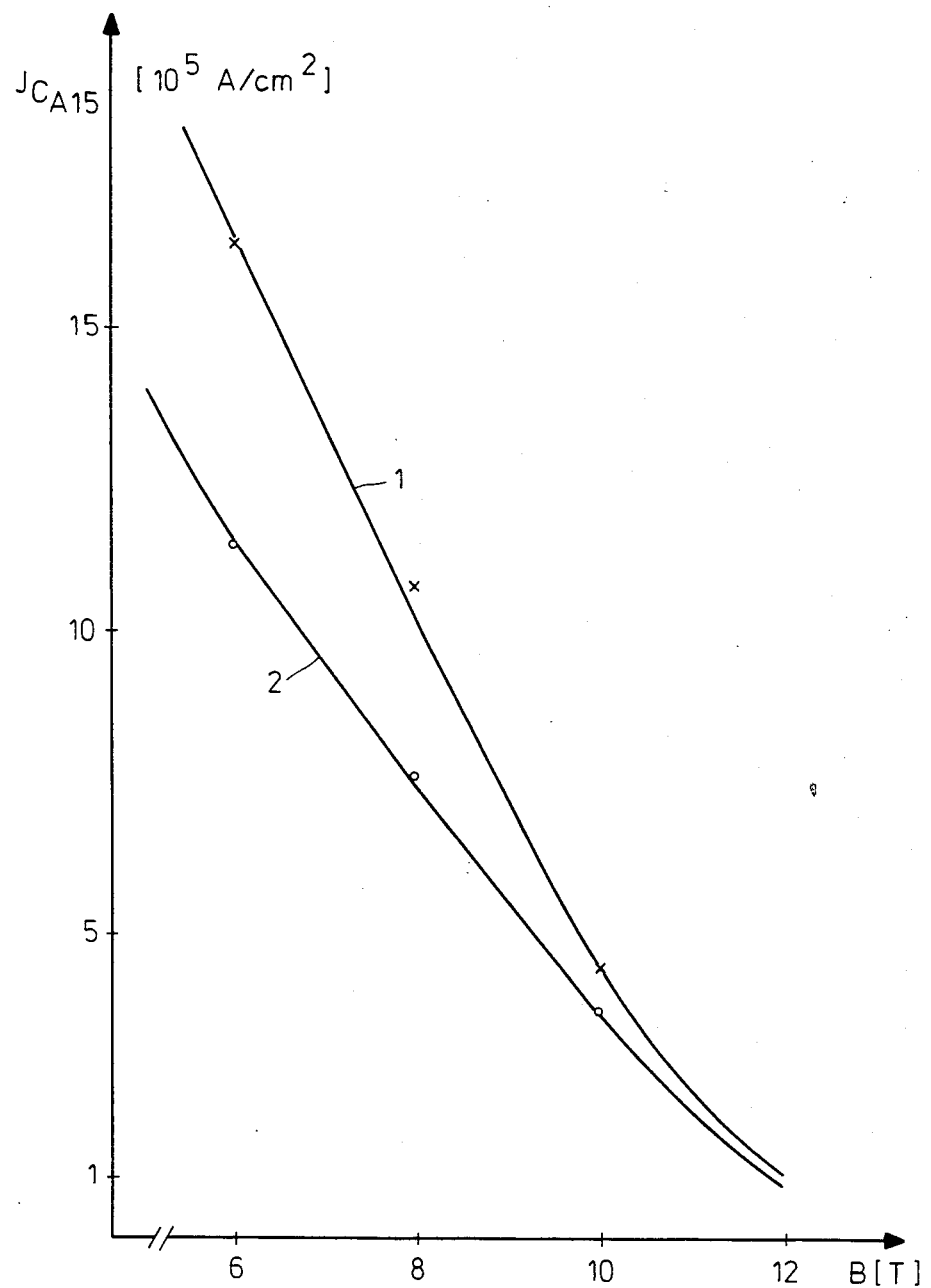

4,746,581

MULTIFILAMENTARY SUPERCONDUCTIVE WIRES COMPOSED OF FILAMENTS NB₃SN OR V₃GA CLAD IN COPPER OR COPPER ALLOYS AND PROCESS FOR MANUFACTURING SUCH WIRES

BACKGROUND OF THE INVENTION

1. Field of the Invention

The present invention relates to multifilamentary superconductive wires clad in copper or a copper alloy and composed of filaments constructed of the superconductive, intermetallic compounds $Nb_3Sn$ or $V_3Ga$, each having an A-15 structure, and additives from the group including rare earth metals, Th, U, Ti, Zr, Hf, V, Nb, Ta, Mo, Fe, Co, Ni, Pd, Cu, Ag, Al, Pt. The invention also relates to a process for manufacturing such superconductive wires.

2. Technology Review

Magnetic fields up to a field intensity of 15 Tesla can today be realized in commercial superconductive laboratory coils at temperatures of 4.2° K. More recent developments have brought magnetic fields of 18 Tesla (at 1.8° K. even up to 20 Tesla) within the realm of the possible. To produce such fields, materials such as $Nb_3Sn$, or $V_3Ga$ (both with an A-15 crystal structure) must be employed. These, however, are all very brittle materials, having an elongation at rupture of about 0.1%. To be able to live with this unfavorable characteristic, a plurality of rather complex procedures has been developed for the production of the respective superconductive wires. In all of these processes, partial elements which do not yet exhibit the final superconductive characteristics but are still ductile, are mechanically deformed into a wire of the final dimensions. This wire is then subjected to a reaction heat treatment between about 550° and about 800° C. to form the superconductive phase. A typical superconductive wire of about 1 mm in diameter is composed of several thousand filaments composed of the above-mentioned A-15 materials. These filaments have diameters (or characteristic dimensions if they deviate from the circular shape) below 5 μm, with individual manufacturing methods even producing typical filament dimensions of <1 μm.

Multifilamentary superconductive wires based on bronze-$Nb_3Sn$ with ternary or quaternary additives of, for example, uranium, titanium, zirconium, hafnium, vanadium, tantalum, iron, nickel, palladium, aluminum or others, are disclosed in European published Patent Application No. 48,313. There, the additives are used to avoid the so-called prestress effect and are alloyed to the niobium and/or the copper or bronze, respectively. The alloy compositions disclosed in the European published patent application and the measures required for the production of superconductive wires, considerably reduce or even prevent the reduced maximum value of the critical current intensity which takes place primarily with high magnetic fields.

With the prior art methods for producing $Nb_3Sn$ or $V_3Ga$ multifilamentary superconductive wires, products are obtained which, at medium magnetic fields (about 12 Tesla), have critical current density (Jc) values around $10^5$ A/cm².

SUMMARY OF THE INVENTION

The present invention provides multifilamentary superconductive wires composed of copper or copper alloy clad filaments and constructed of superconductive, intermetallic compounds $Nb_3Sn$ or $V_3Ga$, each having an A-15 structure, and at least one additive from the group including rare earth metals of atomic number 57 to 71, Th, U, Ti, Zr, Hf, V, Nb, Ta, Mo, Fe, Co, Ni, Pd, Cu, Ag, Al, and Pt. Within the A-15 phase at least one additive element is present in the wire at the grain boundaries of the crystals and/or at the interfaces between the A-15 phase and the copper or with the copper alloy or at the interface between the A-15 phase and a further foreign phase as uniformly and finely distributed, undissolved or at least partially undissolved inclusions.

It is an object of the invention to make available and produce improved multifilamentary superconductive wires of the stated type which assure, in magnetic fields in a range below 12 T, increased current density values of at least 10% compared to the values realizable in the past with the above-mentioned materials.

BRIEF DESCRIPTION OF THE DRAWING

The drawing illustrates the increase in Jc values of a $Nb_3Sn$ conductor containing 85 weight % Nb and 15 weight % Ni (as inclusions) prepared by the process of the present invention (curve 1), compared to the corresponding Jc values for an $Nb_3Sn$ conductor containing 100 weight % Nb in the A-15 structure without Ni inclusions (curve 2).

DETAILED DESCRIPTION OF THE INVENTION

The present invention provides multifilamentary, copper or copper alloy clad, superconductive wires constructed of the superconductive, intermetallic compounds $Nb_3Sn$ or $V_3Ga$, each having an A-15 crystal structure, and additive elements from the group including rare earth elements (metallic elements of atomic number 57 to 71), Th, U, Ti, Zr, Hf, V, Nb, Ta, Mo, Fe, Co, Ni, Pd, Cu, Ag, Al, Pt.

The wires of the present invention are characterized by the presence of at least one additional element in the wire within the A-15 phase at the grain boundaries of the crystals and/or at the interfaces between the A-15 phase and the copper or copper alloy, or at the interfaces between the A-15 phase and a further foreign phase, in the form of uniformly and finely distributed, undissolved or at least partially undissolved inclusions.

The additional element in the inclusion may be present unreacted in elemental form or after reaction with the environment in the form of a separate phase. Binary conductors (e.g. $Nb_3Sn$ or $V_3Ga$ conductors) as well as multinary conductors (i.e., conductors having three or four or more alloy components in the A-15 structure) may be provided with the above additives, if these additives form inclusions, i.e. separate phases. The inclusions generally have radial dimensions of 0.5 μm or less. In a preferred embodiment of the invention, the inclusions have radial dimensions of less than 0.1 μm. It is also preferred that the inclusions be of axially parallel configuration. The sum of the additives in the inclusions range from 0.1 weight % to 50 weight %, with reference to the Nb component in the A-15 phase in the case of $Nb_3Sn$ and with reference to the V component in the A-15 phase in the case of $V_3Ga$.

One method of manufacturing multifilamentary superconductive wires according to the present invention is now described.

(a) A metallic powder of one or a plurality of the above-mentioned additive elements or of one or a plurality of alloys of at least two of the additive elements are mixed with a powder of
  (a$_1$) niobium; or
  (a$_2$) one or a plurality of Nb alloys from the group including Nb-Ta, Nb-Ti, Nb-Zr; or
  (a$_3$) vanadium; or
  (a$_4$) one or a plurality of V alloys from the group including V-Ta, V-Nb, V-Ti, V-Zr;
  with all powders having grain sizes in a range between 0.1 μm and 400 μm diameter and the percentage y of the additive metal or metals in the powder mixture corresponds to a weight percentage value within the limits of $0.1 \leq y \leq 50$;
(b) the powder mixture obtained from (a) is filled into a compactible and evacuatable container of copper or a copper alloy, the enclosed quantity of air is removed and then the powder mixture is compacted together with the closed container by simple or isostatic pressing until a powder density of more than 90% theoretical density (T.D.) is obtained; and
(c) the compacted container is shaped into a wire having a diameter in a range from 0.5 mm to 15 mm and after removal of the outer Cu or Cu alloy layer is processed further into Nb$_3$Sn wires or V$_3$Ga wires.

The process according to the invention may also be practiced by
(a) introducing rods and/or wires of at least one of the above-mentioned additive elements and/or at least one of the alloys of at least two of the additive elements into tubes of
  (a$_1$) niobium; or
  (a$_2$) one or a plurality of Nb alloys of the group including Nb-Ta, Nb-Ti, Nb-Zr; or
  (a$_3$) vanadium; or
  (a$_4$) one or a plurality of V alloys from the group including V-Ta, V-Nb, V-Ti, V-Zr;
  with the percentage z of the additive metal or metals in the total composite of rod/wire-tubes corresponding to a weight percentage value within the limits of $0.1 \leq z \leq 50$;
(b) the filled tubes are plastically deformed into hexagonal cross sections;
(c) the hexagonal tubes are combined into tightly packed bundles which are introduced into a tube of copper or a copper alloy, the latter is deformed into round rods, the outer layer of copper or the copper alloy is completely or partially removed and the rods are further processed into Nb$_3$Sn wires or V$_3$Ga wires.

The presence of uniformly and finely distributed, undissolved or at least partially undissolved inclusions of the above mentioned additive elements, respectively, in the multifilamentary superconductive wire results in the following changes:
  reduction of grain sizes;
  increased density of pinning centers;
  increased sum of interfaces;
  increased critical current density in medium magnetic fields.

During the reaction to form the superconductive compound or the A-15 structure, respectively, toward the end of the manufacturing process in a temperature range between about 550° and about 800° C., the stated inclusions are not dissolved or only partially dissolved in the A-15 structure, or part of the inclusion material forms new compounds with the matrix or core materials of the wire, resulting in additional phases.

For the purpose of thermal stabilization, the outer cladding (or the core) of a superconductive wire is composed of pure copper which is separated from the copper-bronze or from the superconductive material by an Nb or Ta barrier so as to prevent contamination during the reaction heat treatment. To reduce alternating current losses, the wire is twisted about its own axis, with a pitch height of about 20 mm.

The current customary methods for producing Nb$_3$Sn or V$_3$Ga multifilamentary superconductive wires (process step c above) are:
(a) the bronze method (A. R. Kaufmann and J. J. Picket, J. Appl. Phys. 42, 58 (1971));
(b) the external Sn diffusion: for Nb$_3$Sn (M. Suenaga and W. B. Sampson, Appl. Phys. Lett., 20, 443 (1972));
(c) the external Ga diffusion: for V$_3$Ga (R. Bormann and H. C. Freyhardt, IEEE, Trans. Magn., Mag-17, 270 (1981));
(d) the internal Sn diffusion: for Nb$_3$Sn (Y. Hashimoto, K. Yoshizaki and M. Tanaka, 5th Int. Cryogenics Eng. Conf. Proc., IPC Science and Technology Press, London, page 332, 1974);
(e) the cold powder metallurgical method: for Nb$_3$Sn and for V$_3$Ga (R. Flükiger, IEEE Trans. Magn. MAG-16, 1236 (1980));
(f) the modified jelly roll method: for Nb$_3$Sn and for V$_3$Ga (W. K. McDonald, C. W. Curtis, R. M. Scanlan, D. C. Larbalestier, K. Marten and D. B. Smathers, IEEE Trans. Magn. MAG-19, 1124 (1983));
(g) the infiltration method: for Nb$_3$Sn (K. Hemachalam and M. R. Pickus, IEEE Trans. Magn., MAG-13, 466 (1977));
(h) the ECN method: for Nb$_3$Sn (H. Veringa, P. Hoggendahm and A. C. A. Van Wees, IEEE Trans. Magn., MAG-19, 773 (1983));
(i) the "in situ" method: for V$_3$Ga (C. C. Tsuei, Science, 180, 57 (1983)).

Of all methods for the industrial production of Nb$_3$Sn multicore wires known today, three have found the greatest acceptance, namely the "bronze method", the "modified jelly roll" method and the method of "internal Sn diffusion". These methods have one significant feature in common: during the reaction heat treatment, at the end of the wire drawing process (typically about 3 days at 700° C.), the A-15 phase results from a diffusion reaction, i.e. Sn diffuses from the Cu-Sn bronze (which is formed only at the beginning of the desired reaction) and reacts with Nb to form Nb$_3$Sn.

The bronze method has today become the most popular one, but has the drawback that the Cu-13 weight % Sn-bronze work hardens considerably during cold shaping which necessitates a recovery heat treatment after every 50% surface reduction. In all, about 15 to 20 recovery heat treatments of 1 hour at 500° C. become necessary per wire which considerably slows down the manufacturing process. The "modified jelly roll" method starts with thin Nb and Cu-Sn bronze foils which are wound around a copper core and are then extrusion pressed. Due to the thinness of the foils, fewer recovery heat treatments are required than for the bronze method. If the Cu-Sn foil is replaced by Sn, the same situation results as in the third method listed above, the "internal Sn diffusion," in which the recovery heat treatments are eliminated completely, which proves to be time saving and cost effective. The fact that a combination of the elements Cu and Sn is shaped much more easily than the Cu-13 weight % Sn-bronze is another advantage of the internal Sn diffusion method.

$J_c$ is a function of the pinning center density at the grain boundaries and thus of the grain size. Various grain structures have so far been found: relatively large, column-like grains (up to a length of 1 $\mu$m) at the Nb boundary with strong texturing perpendicularly to the axis of the wire, then very fine grains with statistically distributed orientations (800 to 2000 Å after a heat treatment time of 3 days at 700° C.), followed by a coarse grained layer ($\geq$2000 Å) (W. Schauer and W. Schelb, IEEE Trans. Magn. MAG-17, 374 (1981)). The very fine grains contribute the most to $J_c$.

The invention will be described in greater detail below with reference to an example which is given by way of illustration and not by way of limitation. All parts and percentages are by weight unless otherwise noted.

EXAMPLE (bronze method)

To produce the samples, niobium powder was used in grain sizes between 106 and 125 $\mu$m. Its Vickers hardness was about 85 kg/mm$^2$. The additive was nickel powder (about 20 $\mu$m diameter; $H_v$=70-85 kg/mm$^2$). Weighed powder quantities were mixed and then carefully —so they do not demix again—poured through a funnel into a Cu-Zr tube closed at the bottom. This tube had a length of about 7 cm and a diameter of 9 mm. To realize high compaction, the powder was prepressed with about 200 Megapascal (MPa) already when the tube was only partially filled. A plug of Cu-Zr was pressed in from the top at about 300 MPa to seal the tube.

Then the wire was produced, primarily by hammering, in part also by rolling. To bring the inclusions to a dimension of less than 0.1 $\mu$m, it was necessary to reduce the cross-sectional area of the wire to that of the filament to 1/10$^6$. The cross sectional areal reduction rate ($R_a$) is then in this case $R_a$=10$^6$·$R_a$ is dimensionless.

Due to the small sample diameter, it was necessary to bundle several of the conductors together. To do this, the cladding was etched away with diluted nitric acid when a wire diameter of about 1 mm had been reached and then 19 pieces of the conductor were again bundled in a Cu-Zr tube. The second bundling took place in a bronze tube which was then hammered to the final diameter of 0.6 mm.

The concluding reaction heat treatment during which the Nb$_3$Sn A-15 structure was produced took place at 675° C. for a period of 100 hours. The process according to the invention resulted in an increase of the $J_c$ value, at 6 Tesla by 43.6 %, at 8 Tesla by 41.5 % and at 10 Tesla by 17.6 % compared to the corresponding $J_c$ values for an Nb$_3$Sn conductor containing 100 weight % Nb in the A-15 structure without Ni inclusions (see the attached figure). Curve 1 was obtained with the process according to the invention with an Nb$_3$Sn conductor, which contained 85 weight % Nb and 15 weight % Ni (as inclusions), with reference to the sum (Nb+Ni). Curve 2 resulted from the $J_c$ values of the Nb$_3$Sn conductor containing 100 weight % Nb (comparison conductor without inclusions).

The processibility of the other above-mentioned materials is similar to that of nickel. Impurities in the form of oxygen, carbon and nitrogen in the starting materials should be avoided. The Vickers hardness of each of the mixed powders must be approximately the same so that the two types of powder deform uniformly.

The manufacturing example employed the bronze method; however, the desired superconductive wire could also be produced according to the similar methods of internal tin diffusion or the ECN method.

The present application relates to subject matter disclosed in U.S. Pat. application No. P 35 31 770.1 filed Sept. 6, 1985 in the Patent Office of the Federal Republic of Germany, the entire specification of which is incorporated herein by reference.

It is understood that various other modifications will be apparent to and can readily be made by those skilled in the art without departing from the scope and spirit of this invention. Accordingly, it is not intended that the scope of the claims appended hereto be limited to the description as set forth herein, but rather that the claims be construed as encompassing all the features of patentable novelty.

What is claimed is:

1. A multifilamentary, copper or copper alloy clad superconductive wire, comprising:

a superconductive, intermetallic compound Nb$_3$Sn or V$_3$Ga, having an A-15 crystal structure, and at least one additive metal from the group consisting of rare earth elements of atomic number 57 to 71, Th, U, Ti, Zr, Hf, V, Nb, Ta, Mo, Fe, Co, Ni, Pd, Cu, Ag, Al, and Pt, said at least one additive present in the wire within the A-15 phase in the form of uniformly and finely distributed, at least partially undissolved inclusions at grain boundaries of the crystals and/or at an interface between the A-15 phase and the copper or copper alloy, or at an interface between the A-15 phase and a separate phase, wherein said at least partially undissolved inclusions of said additive metal are axially parallel.

2. The multifilamentary superconductive wire as set forth in claim 1, wherein said at least one additive metal is present in the inclusion in unreacted elemental form or in the form of a separate phase.

3. The multifilamentary superconductive wire as set forth in claim 1 wherein said inclusions have radial dimensions of 0.5 $\mu$m or less.

4. The multifilamentary superconductive wire as set forth in claim 3, wherein said inclusions have radial dimensions of less than 0.1 $\mu$m.

5. The multifilamentary superconductive wire as set forth in claim 1, wherein the sum of the additives in the inclusions corresponds to a concentration in a range from 0.1 weight % to 50 weight % with respect to the Nb component in the A 15 phase in the case of Nb$_3$Sn and with respect to the V component in the A-15 phase in the case of V$_3$Ga.

6. The multifilamentary superconductive wire as set forth in claim 1, wherein said at least one additive metal is selected from the rare earth elements of atomic number 57 to 71.

7. The multifilamentary superconductive wire as set forth in claim 1, wherein said at least one additive metal is selected from Th or U.

8. The multifilamentary superconductive wire as set forth in claim 1, wherein said at least one additive metal is selected from Ti, Zr, or Hf.

9. The multifilamentary superconductive wire as set forth in claim 1, wherein said at least one additive metal is selected from V, Nb, or Ta.

10. The multifilamentary superconductive wire as set forth in claim 1, wherein said at least one additive metal is selected from Mo, Fe, Co, or Ni.

11. The multifilamentary superconductive wire as set forth in claim 1, wherein said at least one additive metal is selected from Pd, Cu, Ag, Al or Pt.

12. A process for producing a multifilamentary, copper or copper alloy clad superconductive wire comprising a superconductive, intermetallic compound $Nb_3Sn$ or $V_3Ga$, having an A-15 crystal structure, and at least one additive metal from the group consisting of rare earth elements of atomic number 57 to 71, Th, U, Ti, Zr, Hf, V, Nb, Ta, Mo, Fe, Co, Ni, Pd, Cu, Ag, Al, and Pt, said at least one additive present in the wire within the A-15 phase in the form of uniformly and finely distributed, at least partially undissolved inclusions at grain boundaries of the crystals and/or at an interface between the A-15 phase and the copper or copper alloy, or at an interface between the A-15 phase and a separate phase, wherein said at least partially undissolved inclusions of said additive metal are axially parallel comprising steps for:
(a) mixing a metallic powder of at least one of said additive metals or of at least one alloy of at least two of said additive metals with a powder of
 ($a_1$) niobium; or
 ($a_2$) at least one Nb alloys from the group consisting of Nb-Ta, Nb-Ti, and Nb-Zr; or
 ($a_3$) vanadium; or
 ($a_4$) at least one V alloys from the group consisting of V-Ta, V-Nb, V-Ti, and V-Zr; with all powders having grain sizes in a range between 0.1 $\mu$m and 400 $\mu$m diameter and a percentage y of the additive metal or metals in the powder mixture corresponds to a weight percentage value within the limits of $0.1 \leq y \leq 50$;
(b) filling the powder mixture obtained from (a) into a compactible and evacuatable container of copper or a copper alloy, removing any enclosed quantity of air and then compacting the powder mixture together with the closed container by uniaxial or isostatic pressing until a powder density of more than 90% theoretical density is obtained; and
(c) shaping the compacted container into a wire having a diameter in a range from 0.5 mm to 15 mm and after removal of the outer Cu or Cu alloy layer and alloying the wire with Sn or GA to form $Nb_3Sn$ wire or $V_3Ga$ wire.

13. The process for producing a multifilamentary superconductive wire as set forth in claim 12, wherein said at least one additive metal is selected from the rare earth elements of atomic number 57 to 71.

14. The process for producing a multifilamentary superconductive wire as set forth in claim 12, wherein said at least one additive metal is selected from Th or U.

15. The process for producing a multifilamentary superconductive wire as set forth in claim 12, wherein said at least one additive metal is selected from Ti, Zr, or Hf.

16. The process for producing a multifilamentary superconductive wire as set forth in claim 12, wherein said at least one additive metal is selected from V, Nb, or Ta.

17. The process for producing a multifilamentary superconductive wire as set forth in claim 12, wherein said at least one additive metal is selected from Mo, Fe, Co, or Ni.

18. The process for producing a multifilamentary superconductive wire as set forth in claim 12, wherein said at least one additive metal is selected from Pd, Cu, Ag, Al, or Pt.

19. A process for producing a multifilamentary, copper or copper alloy clad superconductive wire, comprising:
a superconductive, intermetallic compound $Nb_3Sn$ or $v_3Gn$, having an A-15 crystal structure, and at least one additive metal from the group consisting of rare earth elements of atomic number 57 to 71, Th, U, Ti, Zr, Hf, V, Nb, Ta, Mo, Fe, Co, Ni, Pd, Cu, Ag, Al, and Pt, said at least one additive present in the wire within the A-15 phase in the form of uniformly and finely distributed at least partially undissolved inclusions at grain boundaries of the crystals and/or at an interface between the A-15 phase and the copper or copper alloy, or at an interface between the A-15 phase and a separate phase, wherein said at least partially undissolved inclusions of said additive metal are axially parallel comprising steps for:
(a) introducing rods and/or wires of at least one of said additive metals and/or at least one alloy of at least two of said additive metals into a tube of
 ($a_1$) niobium; or
 ($a_2$) at least one Nb alloy from the group consisting of Nb-Ta, Nb-Ti, and Nb-Zr; or
 ($a_3$) vanadium; or
 ($a_4$) at least one V alloy from the group including V-Ta, V-Nb, V-Ti, and V-Zr;
with a percentage z of the additive metal or metals in the total composite of rod/wire-tubes corresponding to a weight percentage value within the limits of $0.1 \leq z \leq 50$ to fill said tube;
(b) plastically deforming said filled tube into hexagonal cross sections to form a hexagonal tube;
(c) introducing tightly packed bundles of said hexagonal tubes into a tube of Cu or a Cu alloy to form a filled tube, deforming said filled Cu or Cu alloy tube into a round rod, at least partially removing the outer layer of Cu or the Cu alloys and alloying the rods with Sn or Ga to form $Nb_3Sn$ wires or $V_3Ga$ wires.

* * * * *